United States Patent
Ochiai et al.

(10) Patent No.: US 6,319,810 B1
(45) Date of Patent: *Nov. 20, 2001

(54) METHOD FOR FORMING SOLDER BUMPS

(75) Inventors: Masayuki Ochiai; Yasuo Yamagishi; Ichiro Yamaguchi; Masahiro Yoshikawa; Koki Otake; Masataka Mizukoshi, all of Kawasaki; Yuuji Watanabe, Aizuwakamatsu, all of (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/659,356

(22) Filed: Jun. 6, 1996

Related U.S. Application Data (63) Continuation-in-part of application No. 08/516,284, filed on Aug. 17, 1995.

(30) Foreign Application Priority Data

| Jan. 20, 1994 | (JP) | 6-004751 |
| Jun. 13, 1995 | (JP) | 7-145962 |
| Feb. 19, 1996 | (JP) | 8-030567 |
| Apr. 1, 1996 | (JP) | 8-078998 |

(51) Int. Cl.[7] .................................................. H01L 21/44
(52) U.S. Cl. ....................................................... 438/616
(58) Field of Search ........................ 438/977, FOR 485, 438/616, FOR 343

(56) References Cited

U.S. PATENT DOCUMENTS

| 3,458,925 | | 8/1969 | Napier et al. |
| 4,919,729 | * | 4/1990 | Elmgren et al. |
| 5,087,590 | * | 2/1992 | Fujimoto et al. |
| 5,136,363 | | 8/1992 | Endo et al. |
| 5,208,186 | | 5/1993 | Mathew |
| 5,217,597 | * | 6/1993 | Moore et al. |
| 5,219,117 | * | 6/1993 | Lin |
| 5,381,848 | | 1/1995 | Trabucco |

FOREIGN PATENT DOCUMENTS

| 242 908 | 2/1987 | (DE) |
| 53-3980 | 2/1978 | (JP) |
| 62-25435 | 2/1987 | (JP) |
| 63-289824 | 11/1988 | (JP) |
| 1-308037 | 12/1989 | (JP) |
| 4-14834 | 1/1992 | (JP) |
| 4-263433 | 9/1992 | (JP) |
| 4-263434 | 9/1992 | (JP) |
| 4-264731 | 9/1992 | (JP) |
| 6-124953 | 5/1994 | (JP) |

* cited by examiner

*Primary Examiner*—David E. Graybill
(74) *Attorney, Agent, or Firm*—Armstrong, Westerman, Hattori, McLeland & Naughton, LLP.

(57) ABSTRACT

Method for forming solder bumps on a first member such as a semiconductor chip having electrode pads formed thereon. A flat plate having holes is prepared and the holes are filled with solder paste by squeezing. The flat plate is then overlapped with the first member with the flat plate above the first plate. The flat plate and the first member are heated to a temperature higher than the melting point of the solder alloy in the solder paste. Therefore, solder bumps having identical sizes and uniform structures can be obtained.

6 Claims, 7 Drawing Sheets

METHOD FOR FORMING SOLDER BUMPS

CROSS REFERENCE TO RELATED ART

This application is a continuation-in-part application of Ser. No. 08/516,284 filed on Aug. 17, 1995.

BACKGROUND OF THE INVENTION

1. Field of the Invention

The present invention relates to a method for forming solder bumps necessary for bump-connection.

2. Description of the Related Art

Recently, high-density mounting of semiconductor devices has been developed for the purpose of miniaturization and weight-reduction of electronic apparatuses such as bump grid array (BGA) packages or semiconductor devices using flip-chips. Since a space corresponding to lead sections can be eliminated by using BGA packages, which space is necessary when quad flat packages (QFP) are used, it is possible to realize a higher-density mounting. Also, according to the flip-chip mounting, it is possible to arrange a plurality of silicon chips on a circuit board to realize an ideal high-density mounting.

While the electric connection of the BGA packages or the flip chips is generally carried out by using solder bumps, it is necessary to form uniform solder bumps having identical metal compositions and/or uniform sizes and having no foreign matter or voids therein in order to realize reliable connections.

There are a plating method and a transfer method of a solder alloy for forming solder bumps. The plating method is mainly applied to the flip-chips, wherein an aluminum pad providing an electrode is thickly plated with the solder in a final step of a wafer process, which is then treated in a reflow furnace to form solder bumps.

In the transfer method, pieces of solder punched out from a thin solder sheet or cut from a solder wire are heated to form solder balls, which are then transferred to electrode pads of a semiconductor device by a transfer tool.

Another transfer method is disclosed in Japanese Unexamined Patent Publication No. 6-124953, wherein a flat plate having cavities at positions corresponding to electrode pads of a semiconductor device is used, and the cavities are filled with a solder paste by squeezing. According to this method, protruding electrodes formed of golden studs are provided on electrode pads of a semiconductor device, which electrodes are then positioned close to the corresponding cavities filled with the solder paste. By heating, a molten solder is adhered to the protruding electrode while enveloping the latter. To transfer the solder paste to the protruding electrode, the semiconductor device is positioned above the flat plate while directing the projection electrodes downward, and brought close to the flat plate to locate the projection electrodes opposite to the holes of the flat plate.

According to the method wherein the flat plate is used, having the cavities corresponding to the electrode pads of the semiconductor device, volumes of the solder paste filled in the respective cavities become equal to each other provided the capacities of the respective cavities are uniform, whereby all the solder balls (solder bumps) thus formed have the same size. Accordingly, it is possible to form a number of micro-solder bumps at once on the semiconductor device or the circuit board.

However, according to the methods wherein the solder balls are formed before the solder bumps are formed, there is a tendency that residual flux or the like sticks on the outer surfaces of the solder balls once formed, resulting that residual flux is interposed between the solder bumps and the electrode pads when the solder balls are transferred to the electrode pads and deteriorates the soldering function. Thus the adhesion of the solder balls to the electrode pads become inferior to cause the fall-off of the solder balls from the electrode pads. Also, the residual flux may be contained in the solder balls (solder bumps) transferred to the electrode pads, which generates bubbles in the solder bumps when the semiconductor device is heated again for the purpose of bonding the semiconductor device to the circuit board by a flip-chip bonding. Accordingly, it is preferable to remove the residual flux or the like stuck to the solder balls by a rinsing process after the solder balls have been formed in the cavities of the flat plate and before the transfer operation is executed. However, there is a risk in that the solder balls may be displaced from the cavities of the flat plate in the rinsing process and cannot be maintained at predetermined positions.

While, according to the method wherein the protruding electrode is provided on the electrode pad of the semiconductor device, the protruding electrode comprises a golden stud formed on the electrode pad by wire bonding. Since wire bonding is carried out one by one, a longer time period is necessary for repeating the wire bondings a number of times, and also it is difficult to carry out wire bonding for an electronic device including elements arranged at a micropitch. Further, according to the structure wherein the molten solder sticks to the protruding electrode while enveloping the latter, a size of the solder bump becomes larger than that of the protruding electrode, so it is difficult to form micro-solder bumps at a smaller pitch. Also, since the semiconductor device is positioned above the flat plate during the transfer process, the solder paste must move to the protruding electrode against the force of gravity.

A further transfer method is disclosed in Japanese Unexamined Patent Publication No. 4-263433. According to this method, a flat plate is used, having cavities at positions corresponding to electrodes of a semiconductor device. The cavities of the flat plate are filled with a solder paste by squeezing, and thereafter, the flat plate is heated so that the solder paste in the cavities forms solder balls.

The solder paste is a mixture of fine solder powders and a flux or a solvent. When the solder paste is heated, the solvent is evaporated and a molten solder is rounded due to surface tension to form a solder ball. Then, a semiconductor device is brought close to the flat plate having the solder balls held in the cavities, while positioning electrode pads of the semiconductor device relative to the cavities of the flat plate. Then the solder balls in the cavities are transferred to the electrode pads of the semiconductor device, using a heating and pressing device.

However, a throughput per an apparatus used in this method is low, because a considerable time is necessary to heat the flat plate and the semiconductor chip, to allow the solder to flow onto the entire surface of the electrode pad, and to cool the flat plate and the semiconductor chip, each time after the positioning step.

Also, the inventors have noted a problem that an oxidation on the surfaces of the solder bumps and the electrode pads advances when they are heated to transfer the solder bumps to the electrode pads, with the result that a low wettability of the electrode pads to the solder is deteriorated. If the electrode pad is coated with a metal layer and the melting point of the solder is lower than 200° C., the problem will not be so serious. However, if the solder bumps are directly transferred to the electrode pads made of copper or nickel which do not dissolve so much in the solder, the electrode pads are less wettable to the solder. If the solder includes Pb as a main component (for example, Pb-10Sn, Pb-5Sn) having a high melting point, the electrode pads are sometimes heated above 300° C., with the result that the copper or nickel electrode pads are easily oxidized in a short time and the flux residuals on the surface of the solder balls are carbonized. Therefore, the electrode pads are hardly wettable to the solder. Usually, after the solder balls are formed, a flux is applied to the solder balls and the solder balls are reheated above the melting point of the solder to modify the shape of the solder balls. Therefore, even when the solder balls are transferred to the electrode pads in the above described condition, it seems that the peripheries of the bottoms of the solder bumps (balls) are satisfactorily adhered or soldered to the electrode pads by the action of the flux and it appears that good solder bumps are formed on the electrode pads. However, if a force is applied to the solder bump by a pin to remove the solder ball from the electrode pad, it has been found that the inner area of the bottom of the solder bump is not adhered to the electrode pad to a satisfactory degree. In addition, the thermally deteriorated flux residual on the surface of the solder ball remain between the solder ball and the electrode pad, and the electrode pads do not get wet with the solder even if the heating operation is repeated. Therefore, the solder balls are not sufficiently adhered to the electrode pads. The connecting force will be weak depending on the degree of adhesion of the inner portions of the bottoms of the solder bumps to the electrode pad and a stress after semiconductor chip is mounted to the substrate such as a stress caused by a difference of thermal expansion between the substrate and the semiconductor chip concentrates on the narrow adhered area, so a reliability is decreased.

The problem of the low throughput and the low wettability to the solder of the prior art is fundamentally caused by simultaneously carrying out the positioning and the transferring the solder balls to the electrode pads. Therefore, in the case of the combinant of the widely used solder including Pb as a main component and having a high melting point (higher than 300° C.) and the nickel electrode pads, it was difficult to obtain reliable solder bumps at a lower cost in the prior art.

SUMMARY OF THE INVENTION

The object of the present invention is to provide a method for forming solder bumps having a uniform size and containing no foreign matter and voids therein.

Another object of the present invention is to provide a method for forming small solder bumps which can be arranged at a micro-pitch.

According to one aspect of the present invention, there is provided a method for forming solder bumps, the method comprising the steps of preparing a first member having electrode pads formed thereon and preparing a flat plate having holes formed on a first surface thereof at positions corresponding to those of the electrode pads, filling the-holes of the flat plate with a solder paste by squeezing, overlapping the flat plate with the first member one above another while the electrode pads are positioned relative to the holes filled with the solder paste, and heating the flat plate and the first member overlapped with each other to a temperature higher than a melting point of a solder metal in the solder paste.

It is possible to equalize the volumes of the solder paste in the respective holes by squeezing. Then, the flat plate filled with the solder paste is overlapped with the first member and heated while maintaining the overlapped condition, whereby the solder metal in the solder paste filled in the holes of the flat plate can be directly transferred to the first member. Preferably, the first member is one selected from the group of a semiconductor chip, a semiconductor device and a circuit board. The solder paste comprises fine solder powders mixed in and kneaded with a flux or a solvent. Therefore, the solvent evaporates by heating and the molten solder metal adheres to the electrode pads of the first member. The flux is still active to enhance the soldering function of the molten solder metal to the electrode pads. Accordingly, the problems which may occur when the solder balls are formed before solder bumps are formed can be solved. Further, it is possible to shorten the production process.

Preferably, the electrode pad comprises a generally flat layer formed on a surface of the first member. Preferably, the heating is carried out while the flat plate is disposed above the first member. Thereby, the solder paste and the solder metal contained therein flows downward due to gravity through the holes of the flat plate as the solder metal is softened by heating, and the solder metal is easily soldered or adhered to the electrodes disposed beneath the holes.

Preferably, the flat plate has a second surface opposite to the first surface, and the hole has an opening at the first surface but no opening at the second surface. That is, the holes are not though holes.

On the other hand, the flat plate has a second surface opposite to the first surface, and the hole has opening at the first and second surfaces. In this case, the holes are not though holes and function as gas-releasing holes.

If the holes are through holes, an additional plate is used in such a manner that the additional plate is overlapped with the second surface of the flat plate and the holes are filled with the solder paste, and the flat plate and the first member overlapped with each other are heated to a temperature higher than a melting point of the solder metal in the solder paste after the additional plate has been removed from the flat plate. According to this measure, the openings of the through holes on the second surface of the flat plate are closed when the solder paste is filled, so that the leakage of the solder paste is inhibited. When the transfer operation is carried out, the through holes are opened and function as gas-releasing holes.

Preferably, the solder paste comprises solder powders and the remaining portion includes a flux, the remaining portion comprising components selected such that, when the weight of the remaining portion at a normal temperature is 100 parts by weight, a decrease in weight of the remaining portion after it is maintained for five minutes at a melting point of the solder metal is smaller than 10 parts by weight. The remaining portion contains an organic substance such as flux vehicle or the like which generates gas when heated. When the flat plate and the first member overlapped with each other are rapidly heated, a pressure of the gas due to the evaporation of the flux vehicle becomes high, and tends to separate the flat plate from the first member and to cause the positional offset therebetween. Also, the organic substance may enter the solder bumps. Accordingly, it is necessary to prevent the positional offset from occurring due to the gas of the evaporated flux vehicle. According to this measure, the material is so selected that the flux vehicle volatilizes only to a smaller degree so that no positional offset due to the gas of the evaporated flux vehicle occurs.

Similarly, preferably, the solder paste comprises solder powders and the remaining portion including a flux, the remaining portion comprises components selected such that, when the weight of the remaining portion at a normal temperature is 100 parts by weight, a decrease in weight of the remaining portion after it is maintained for five minutes at a melting point of the solder metal is in the range between 10 to 95 parts by weight, and wherein the heating step is carried out in such a manner that the assembly of the flat plate and the first member is first heated to a temperature lower by 10 to 30° C. than the melting point of the solder metal for a period longer than one minute and then elevated to a temperature higher than the melting point. In this case, although the flux vehicle may readily volatilize, the rapid evaporation thereof can be suppressed by carrying out the heating operation at a slow pace.

Preferably, the electrode pad is formed of one of a copper film and a nickel film, and the thickness of the electrode pad is thicker than 1 $\mu$m. Thereby, it has been found that the electrode pads are well wetted with the solder metal so that soldering is reliably realized even when the solder bumps are formed directly from the solder paste. In this case, a film made of one selected from the group of gold, a primary metal composing a solder metal and a solder alloy is preferably applied to the electrode pad.

Preferably, the flat plate is made of a material having a thermal expansion close to that of the first member, so that the positional offset is prevented from occurring during the transferring operation. In this case, if the flat plate and the first member are made of a semiconductor, the difference in the thermal expansion becomes small between the flat plate and the first member.

Preferably, the flat plate is made of silicon, and the holes of the flat plate are formed by anisotropic etching using an alkali etchant. Thereby, small holes having the identical sizes can be formed on the flat plate.

The flat plate may be formed of a photosensitive glass sheet, and the holes of the flat plate are formed by a patterning exposure and a subsequent selective etching.

Also, the flat plate may be formed by preparing a mold of the same shape as the flat plate and molding the flat plate while using the mold.

According to another aspect of the present invention, there is provided a method for forming solder bumps, the method comprising the steps of: preparing a first member having electrode pads formed thereon and preparing a flat plate having through holes formed on a first surface thereof at positions corresponding to those of the electrode pads, overlapping the flat plate with the first member one above another while the electrode pads are positioned relative to the through holes, filling the through holes of the flat plate with a solder paste by squeezing, and heating the flat plate and the first member overlapped with each other to a temperature higher than a melting point of a solder metal in the solder paste.

According to a further aspect of the present invention, there is provided a method for forming solder bumps, the method comprising the steps of: filling holes of a flat plate with a solder paste by squeezing; heating the flat plate to a temperature higher than the melting point of the solder to form solder balls from the solder paste in the holes of the flat plate; removing an oxidation layer on electrode pads of an electric component arranged at positions corresponding to those of the holes of the flat plate; overlapping the flat plate with the electric component one above another while the solder balls are positioned relative to the electrode pads; and heating the flat plate and the electric component overlapped with each other to a temperature higher than the melting point of the solder to transfer the solder balls from the flat plate to the electric component.

In this method, the solder balls are formed in the holes of the flat plate and then transferred from the flat plate to the electric component. Prior to transfer the solder balls, the electric component is treated to remove any oxidation layer formed on electrode pads. The subsequent overlapping step is carried out at a normal temperature or at a relatively low temperature so that the flat plate and the electric component are not subjected to a high temperature and oxidation does not occur on the surface of the solder balls and the electrode pads. The oxidation layer may deteriorate soldering action of the solder to the electrode pads, but it is possible to avoid any deterioration of soldering action of the solder to the electrode pads by removing the oxidation layer, and reflow under the atmosphere containing very low $O_2$.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 1A:
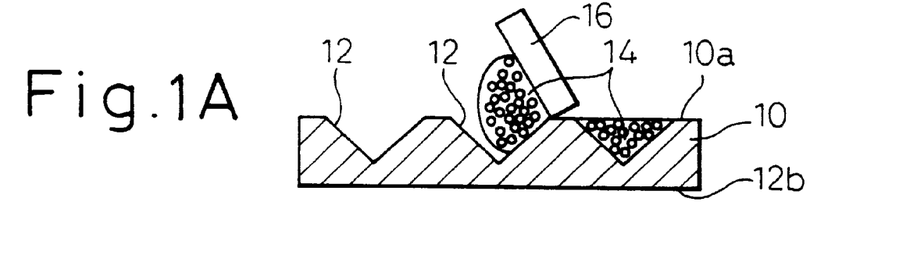
FIGS. 1A to 1C are cross-sectional views illustrating the first embodiment of the present invention.
Figure 1B:
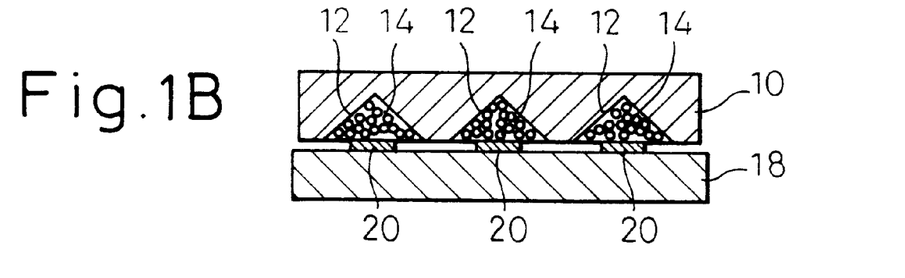
Figure 1C:
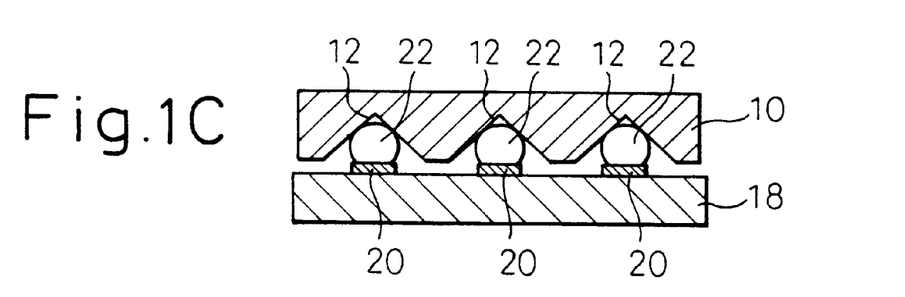

FIGS. 1A to 1C illustrate a method for forming solder bumps according to the first embodiment of the present invention. As shown in FIG. 1A, a flat plate 10 is prepared, which has a plurality of holes (cavities) 12 of the identical shapes on the flat surface 10a thereof. In this embodiment, the holes 12 are in a square pyramidal shape having an opening on the surface 10a but having no opening on the other surface 10b. The holes 12 are provided in a matrix pattern at an appropriate pitch, for example, of several hundreds microns.

The holes 12 of the flat plate 10 are filled with a solder paste 14, using a squeegee 16. If the volumes of all the holes 12 are equal to each other, amounts of the solder paste 14 filled in the holes 12 are uniform. The solder paste 14 is a mixture of fine solder powders with a flux, a solvent or others. The solder powders are prepared from an alloy selected from the group of, for example, Sn—Pb, Sn—In, Sn—Bi and Sn—Ag.

As shown in FIG. 1B, a first member 18 having electrode pads 20 formed thereon is also prepared. The first member 18 is an electronic element which needs solder bumps for the purpose of the flip-chip bonding or the formation of BGA, and comprises, for example, a semiconductor chip, a semiconductor device or a circuit board. The holes 12 of the flat plate 10 are arranged at positions corresponding to positions of the electrode pads 20 of the first member 18.

After the holes 12 of the flat plate 10 are filled with the solder paste 14 by squeezing in FIG. 1A, the flat plate 10 is overlapped with the first member 18 while positioning the holes 12 of the flat plate 10 to coincide with the electrode pads 20 of the first member 18, as shown in FIG. 1B. Preferably, the flat plate 10 is arranged on the upper side of the first member 18, with the holes 12 directed downward.

Then, as shown in FIG. 1C, the flat plate 10 and the first member 18 are heated in a furnace to a temperature higher than a melting point of the solder in the solder paste 14, while maintaining the overlapped state of the flat plate 10 with the first member 18. When the solder paste 14 is heated, the solvent evaporates and the molten solder alloy in each hole 12 gathers into a rounded form and adheres to the electrode pad 20 of the first member 18 to form a lump of solder bump 22. Flux is still active to assist the soldering function of the molten solder alloy to the electrode pad 20. In this way, the solder component of the solder paste 14 can be simply and reliably transferred to the first member 18. Thereafter, the flat plate 10 is removed from the first member 18.

Figure 2:
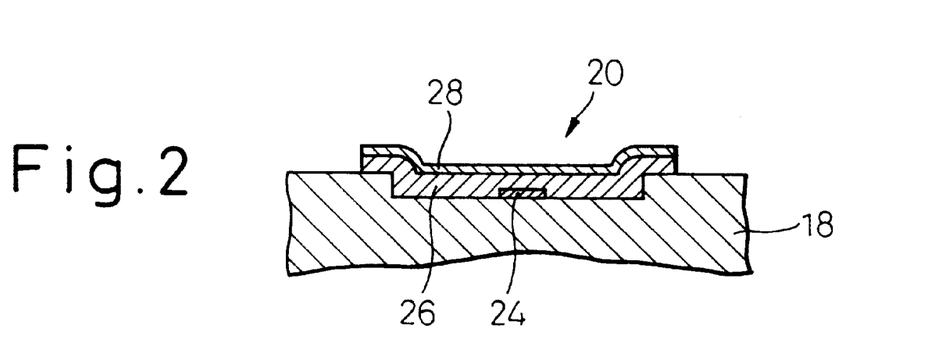
FIG. 2 is a cross-sectional view illustrating an example of then electrode pad.

FIG. 2 shows an example of the electrode pads 20. This electrode 20 is a generally flat layer formed on the surface of the first member 18. An aluminum wire 24 extends on the surface of the first member 18 and an electrode layer 26 of copper or nickel is provided on the aluminum wire 24. It has been found that, by forming the electrode pad 20 with the electrode layer 26 of copper or nickel having a thickness of 1 μm or more, the solder bump 22 can be formed on the electrode pad 20 directly from the solder paste 14, while ensuring the wettability of the electrode pad 20 to the solder. In this regard, in order to improve the wettability, it is preferable to apply a metallic film, selected from the group of gold, a primary metal composing a solder alloy (such as Sn) and the solder alloy itself (such as Sn—Pb), to the electrode pad 20.

As shown in FIG. 1C, when the heating operation is carried out while disposing the flat plate 10 on the upper side and the first member 18 on the lower side, the solder paste 14 filled in the holes 12 of the flat plate 10 tends to flow downward from the holes 12 of the flat plate 10 due to the gravity force as the solder alloy in the solder paste is softened, and readily adheres to the electrode pads 20 disposed beneath the holes 12.

As described previously, the solder paste 14 comprises solder powders and the remaining portion including flux. The other remaining portion will include an organic component such as a flux vehicle, which generates gas when it is heated. If the flat plate 10 and the first member 18 overlapped with each other are rapidly heated, a gas pressure derived from the evaporation of the flux vehicle becomes high, and tends to separate the flat plate 10 from the first member 18, whereby the positional offset of the solder bumps 22 to be formed may occur. Also, the organic component may enter the solder bump 22. Accordingly, it is necessary to minimize the positional offset due to the evaporated gas of the flux vehicle as much as possible.

It will be understood that the positional offset due to the evaporated gas of the flux vehicle can be prevented from occurring if the material for the flux vehicle is so selected that the flux vehicle volatilizes to only a smaller degree so that the movement of the flat plate 10 due to the pressure of the evaporated gas is avoided. To this end, it is preferable that the remaining portion including the flux vehicle comprises components selected such that, when the weight of the remaining portion at a normal temperature is 100 parts by weight, a decrease in weight of the remaining portion after it is maintained for five minutes at a melting point of the solder metal is smaller than 10 parts by weight. For example, in the case of Sn—Pb eutectic crystal solder, it is possible to prepare a non-volatile flux vehicle by using polymerized rosin as a resin and benzyl benzoate (melting point 323° C.) as a solvent. The non-volatile property is further enhanced by distilling a commercially available polymerized rosin at a high temperature of about 250° C. to collect the non-volatile component.

For the flip chip mounting, Sn-5Pb or Sn-10Pb having a melting point close to 300° C. is often used. In such a case, since the bump formation is carried out at a high temperature in the range between 320° C. and 350° C., it is difficult to obtain the non-volatile property wherein the weight reduction is 10 or less. Accordingly, in this case, the heating is preferably carried out at a slow pace to prevent the quick evaporation of the flux vehicle. In particular, it is advisable that the remaining portion comprises components selected such that, when the weight of the remaining portion at a normal temperature is 100 parts by weight, the decrease in weight of the remaining portion after it is maintained for five minutes at a melting point of the solder metal is in the range between 10 to 95 parts by weight, and wherein the heating step is carried out in such a manner that the assembly of the flat plate and the first member is first heated to a temperature lower by 10 to 30° C. than the melting point of the solder metal for a period longer than one minute and then elevated to a temperature higher than the melting point. Although the holding temperature is preferably close to the melting point provided it is lower than the melting point, it is practical to select a temperature lower by 10 to 30° C. than the melting point of the solder alloy in consideration of a possible temperature unevenness in the furnace and/or the reproducibility of the temperature. Although the holding time may vary in accordance with heating profiles and boiling points of the flux vehicles, it should be one minute or more, preferably three minutes or more, at a temperature lower than the melting point of the solder alloy. Since the volume of the solder paste 14 is reduced due to the evaporation of the flux vehicle, preferably the flat plate 10 is disposed on the upper side and the first member 18 is on the lower side, for the purpose of maintaining the contact between the solder paste 14 and the electrode pad 20.

In this respect, if an amount of residual flux vehicle is 5% or less (i.e., the weight reduction is 95% or more) after being maintained for five minutes at the melting point, the solder powders are difficult to coagulate with each other, and the formation of the solder bumps 22 is difficult.

For example, when the solder bumps 22 are provided at a small pitch of 0.22 mm or less on a large silicon bare chip of a size larger than 15 mm, a positional offset may occur if the difference in a thermal expansion between the flat plate 10 and the first member 18 is large. In such a case, the flat plate 10 is preferably made of a material having a thermal expansion close to that of the first member 18. According to this solution, the positional offset during the transfer process is minimized. For example, if both the flat plate 10 and the first member 18 are formed of a semiconductor (silicon), the difference in the thermal expansion between the flat plate 10 and the first member 28 can be minimized.

There are two methods for reliably forming small holes 12 having the identical sizes on the flat plate 10. First, the flat plate 10 is subjected to a patterning exposure and a subsequent chemical etching. Another, the holes 12 are mechanically formed on the flat plate 10. In general, etching can be carried out at a lower cost. The etching method includes the step of isotropic etching of a glass plate or a metallic plate, the anisotropic etching of a silicon wafer, and the selective etching which is solely applied to a photosensitive glass plate. The mechanical method includes drilling and electric discharge machining of a metallic plate.

Figure 3A:
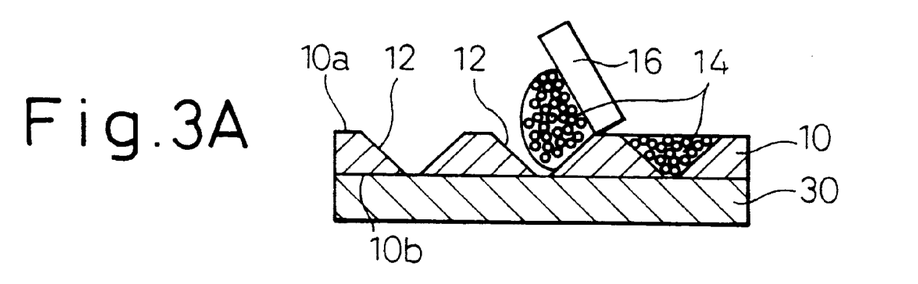
FIGS. 3A to 3D are cross-sectional views illustrating the second embodiment of the present invention.

FIGS. 3A to 3D illustrate the formation of metallic bumps according to the second embodiment of the present invention. Similarly to the embodiment described with reference to FIGS. 1A to 1C, a flat plate 10 is prepared, which has a plurality of identically shaped holes 12 on the flat surface 10a thereof, as shown in FIG. 3A. In this embodiment, the holes 12 are of a square pyramidal shape having openings on the surface 10a as well as on the other surface 10b. In other words, the holes 12 are through holes. In FIG. 3A, an additional plate 30 is overlapped with the flat plate 10 to close the openings on the other surface 10b. While maintaining such a state, the holes 12 of the flat plate 12 are filled with a solder paste 14, using a squeegee 16. The additional plate 30 is used for inhibiting the solder paste 14 from leakage through the openings of the holes 12 on the other surface 10b.

Figure 3B:
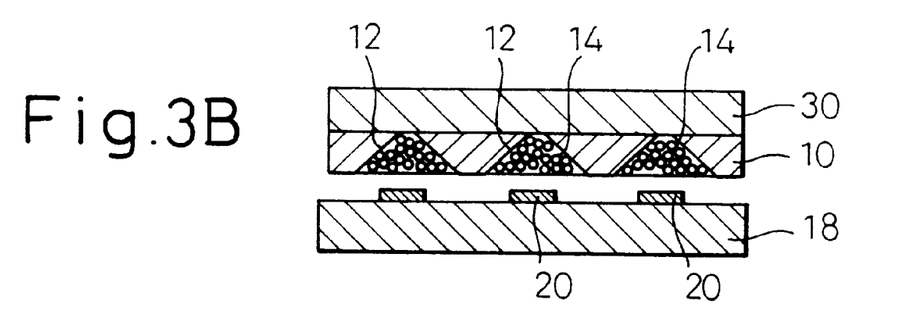

As shown in FIG. 3B, a first member 18 having electrode pads 20 formed thereon is provided. The first member 18 is an electronic element which needs solder bumps for the purpose of flip-chip bonding or the formation of a BGA, such as a semiconductor chip, a semiconductor device or a circuit board. The holes 12 of the flat plate 10 are arranged at positions corresponding to positions of the electrode pads 20 of the first member 18.

Figure 3C:
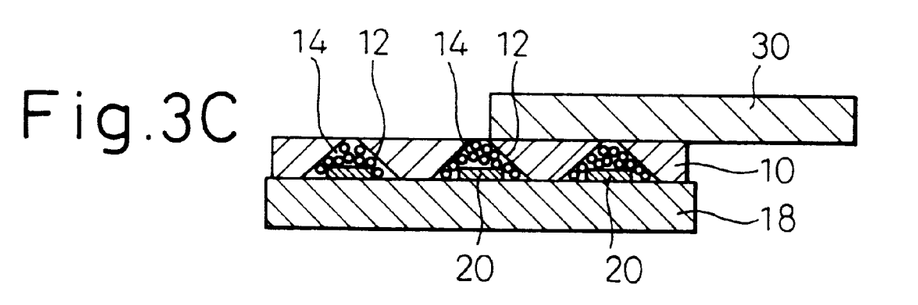

Then, the flat plate 10 with the additional plate 30 is overlapped with the first member 18 so that the holes 12 of the flat plate 10 coincide with the electrode pads 20 of the first member 18. Next, as shown in FIG. 3C, the additional plate 30 is removed from the flat plate 10 to expose the openings of the holes 12 on the other surface 10b of the flat plate 10. Since the holes 12 are of a pyramidal shape, the area of the opening of the hole 12 on the one surface 10a is larger, and the area of the opening on the other surface 10b is smaller.

Figure 3D:
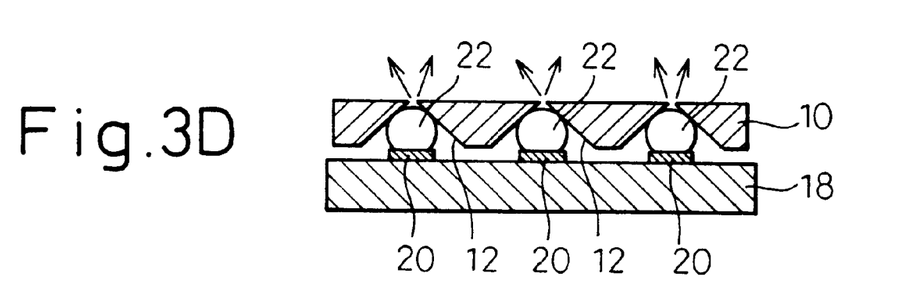

As shown in FIG. 3D, the flat plate 10 and the first member 18 overlapped with each other are heated in a furnace to a temperature above the melting point of the solder alloy in the solder paste 14. As the solder paste 14 is heated, the solvent therein evaporates and gathers into molten solder balls which adhere to the electrode pads 20 of the first member 18 to form solder bumps 22. Since the flux is still active, the soldering function is reliably realized between the molten solder bumps 22 and the electrode pads 20. In this way, the solder component in the solder paste can be reliably and easily transferred to the first member 18. Thereafter, the flat plate 10 is removed from the first member 18.

The solder paste 14 comprises solder powders and the remaining portion including a flux, as stated previously. The remaining portion includes an organic substance such as a flux vehicle which generates gas when heated. In this embodiment, the holes 12 are through holes, and the gas generated by the evaporation of the flux vehicle can escape from the holes 12 even if the flat plate 10 overlapped with the first member 18 is rapidly heated, whereby the abovementioned problems due to the gas pressure are avoidable.

Figure 4A:
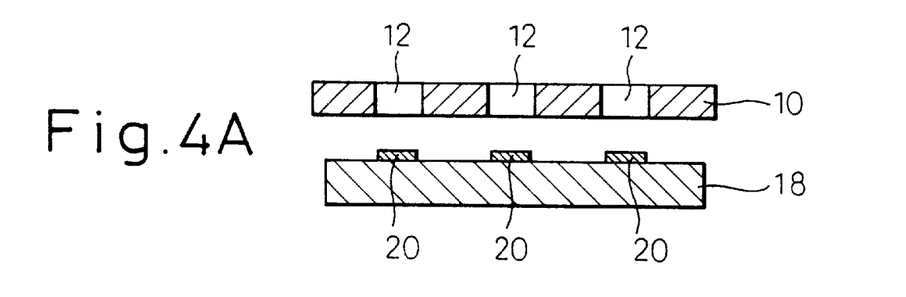
FIGS. 4A to 4C are cross-sectional views illustrating the third embodiment of the present invention.
Figure 4B:
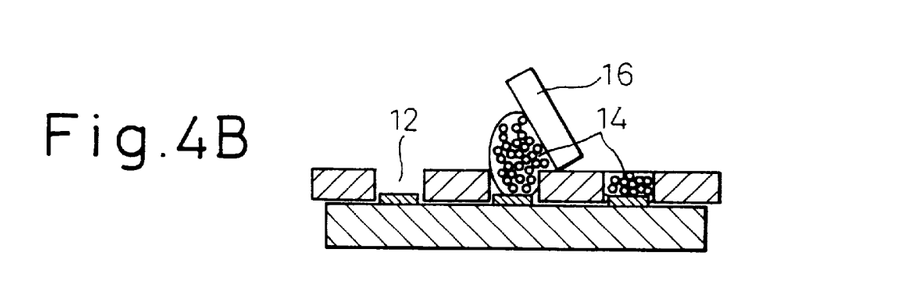

FIGS. 4A to 4C illustrate the formation of metallic bumps according to the third embodiment of the present invention. As shown in FIG. 4A, a flat plate 10 is prepared, which has a plurality of identically shaped holes 12 on the flat surface 10a thereof. In this embodiment, the holes 12 are through holes having a straight cross-section. As shown FIG. 4B, a first member 18 having electrode pads 20 formed thereon is also prepared. The first member 18 is an electronic element which needs solder bumps for the purpose of flip-chip bonding or the formation of a BGA, such as a semiconductor chip, a semiconductor device or a circuit board. The holes 12 of the flat plate 10 are arranged at positions corresponding to positions of the electrode pads 20 of the first member 18.

Then, the flat plate 10 is overlapped with the first member 18 so that the holes 12 of the flat plate 10 coincide with the electrode pads 20 of the first member 18. Next, a solder paste 14 is filled in the holes 12 of the flat plate 10, using a squeegee 16. In this embodiment, the lower ends of the holes 12 are closed by the first member 18, and the solder paste 14 is prevented from oozing out from the lower ends of the holes 12, whereby the volumes of the solder paste 14 filled in the respective holes 12 by squeezing are equal to each other.

Figure 4C:
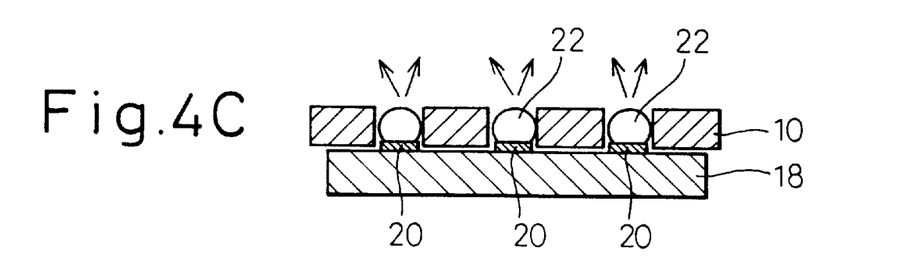

As shown in FIG. 4C, the flat plate 10 and the first member 18 are heated in a furnace to a temperature above the melting point of the solder alloy of the solder paste 14, while maintaining the overlapped state of the flat plate 10 and the first member 18. As the solder paste 14 is heated, the solvent therein evaporates and the paste gathers into molten solder balls which adhere to the electrode pads 20 of the first member 18 to form solder bumps 22. Since the flux is still active, reliable adhesion is obtainable between the molten solder alloy and the electrode pad 20. Since gas generated due to the evaporation of flux vehicle can escape from the holes 12, the above-mentioned problems due to the gas pressure are avoidable.

Preferably, in the above described embodiments, the flat plate 10 is made of-silicon, and the holes 12 thereof are formed by anisotropic etching using an alkali etchant. Thus, small holes 12 of the same size can be reliably formed on the flat plate 10.

Alternatively, the flat plate 10 is made of a photosensitive glass, on which the holes 12 are then formed by a patterning exposure and selective etching.

In addition, as a mechanical method, the flat plate 10 can be formed by preparing a mold having the same shape as the flat plate 10 with holes 12 and by molding the flat plates with the use of that mold. Also, there are other methods such as electroforming nickel or casting thermosetting resin if the melting point of the solder is low. When using the flat plate which is made by any of the manufacturing methods, the surface of the flat plate must not be wettable to the solder. If the flat plate is easily wettable to the solder, the surface of the flat plate is preferably coated with a material such as chromium which is hardly wettable by the solder.

The present invention will be further described with reference to the following examples:

EXAMPLE 1

Formation of Solder Bumps on BGA Package

The package (first member 18) has 256 electrode pads 20 of copper arranged at a pitch of 1.27 mm and the diameter of electrode pads 20 is 640 $\mu$m.

The flat plate 10 is made from a stainless steel sheet having a size of 50×50×2 mm. The holes 12 are 1.15 mm in diameter and 500 μm in depth and are formed in the flat plate by wet etching method at positions corresponding to positions of the electrode pads. Thereafter, the surface of the flat plate 10 is coated with chromium.

Solder powders in the solder paste 14 comprise commercially available eutectic crystal Sn—Pb. The remaining portion in the solder paste 14 other than the solder powders includes (a) 60 parts by weight of a non-volatile residue of polymerized rosin having a 80% polymerization degree, distilled in a nitrogen atmosphere at 250° C., (b) 39 parts by weight of benzyl benzoate and (c) 1 part by weight of cyclohexylamine hydrochloride, which are kneaded with each other to form a flux vehicle. The weight reduction of the flux vehicle was 3% or less after being heated at 183° C. (melting point of solder) for five minutes. The solder paste 14 is obtained by mixing and kneading 1000 parts by weight of the flux vehicle with 900 parts by weight of the solder powders of Sn-Pb.

After the solder paste is applied to the flat plate 10 by squeezing, the assembly of the flat plate 10 and the first member 18 are inserted in a hot air reflow furnace, and the temperature is raised to 230° C. at a rate 40° C./min, whereby the solder powders are molten to form solder bumps 22 on the electrode pads 20.

After the flat plate 10 is removed, rosin flux is coated on the solder bumps 22 and a reflow treatment is again carried out in a nitrogen atmosphere to modify the bump shape. The residual flux was rinsed with a rinsing liquid (Perclean A011 provided by Nittoh Kagaku K.K.).

According to the this method, solder bumps having the height of 600 μm are obtained, with the result that deviation in the heights of the solder bumps is 15 μm and there are no defective solder bumps.

EXAMPLE 2

Formation of Solder Bumps on Silicon Chip

The silicon chip (first member 18) has 25×25 nickel electrode pads 20 arranged at a pitch of 210 μm, and the electrode pads 20 each have a diameter of 80 μm and a thickness of 4 μm.

The flat plate 10 is made from a photosensitive glass plate (PEG 3 provided by HOYA K.K.) having a size of 30×30×3 mm. The holes 12 have square openings with a length of one side of 166 μm and a depth of 71 μm. The holes are formed on the flat plate 10 at positions corresponding to positions of the electrode pads by exposure and etching.

Solder powders in the solder paste 14 are Sn—Pb (having a particle size in the range between 10 to 32 μm). The remaining portion in the solder paste 14 other than the solder powders includes (a) 45 parts by weight of polymerized rosin having a 80% polymerization degree, (b) 53 parts by weight of benzyl benzoate and (c) 2 part by weight of succinic anhydride, these components being mixed and kneaded with each other to form a flux vehicle. The weight reduction of the flux vehicle is about 70% after being heated at 300° C. (melting point of solder) for five minutes. The solder paste 14 is obtained by mixing and kneading 1000 parts by weight of the flux vehicle with 900 parts by weight of the solder powders of Sn—Pb.

The assembly of the flat plate 10 and the first member 18 is treated in a infrared reflow furnace, and the temperature is raised to 280° C. at a rate 30° C./min, maintained for 3 minutes at that temperature, and then raised to 350° C., whereby the solder powders are melted to form solder bumps 22 on the electrode pads 20. The temperature is maintained higher than the melting point for two minutes.

After removing the flat plate 10, the solder bumps 22 are coated with rosin flux, and again subjected to a reflow process in a nitrogen atmosphere to modify the bump shape. Then, the residual flux was rinsed with a rinsing liquid.

According to the this method, solder bumps of a height of 92 μm are obtained with the result of deviation (standard deviation) of 3.5 μm and without any defective solder bumps. Also it is confirmed by an X-ray transmission camera that there are no voids in the solder bumps.

EXAMPLE 3

Formation of Solder Bumps on Silicon Chip

The silicon chip (first member 18) is similar to that used in Example 2, except that the nickel electrode pads are plated with gold having the thickness of 0.05 μm.

The flat plate 10 is formed from a silicon <100> wafer of a size of 30×30×0.34 mm (on which a thermal oxidation layer was formed). Resist patterns having a size of 195 μm square are formed on the flat plate at positions corresponding to positions of the electrode pads. Then, part of the oxidation layer other than that covered with the resist (including the oxidation layer on the back surface) is removed by hydrofluoric acid. Thereafter, the silicon wafer is etched, using an aqueous solution of KOH, whereby the flat plate 10 having the thickness of 120 μm and through holes 12 in the form of a square frustro-pyramidal shape.

The solder paste 14 is obtained from 90% by weight of solder powders Sn—Pb (having a particle size in the range between 10 through 20 μm) dispersed in 10% by weight of a rosin type flux vehicle.

The flat plate 10 is overlapped with a plate (additional plate 30) made of fluorine type resin, and the through holes 12 in the flat plate 10 are filled with the solder paste by squeezing. After removing the additional plate 30 from the flat plate 10 and overlapping the flat plate 10 with the silicon chip 18, the flat plate 10 with the silicon chip 18 is treated in an infrared reflow furnace, and the temperature is raised to 350° C. at a rate of 100° C./min. The solder powders are melted to thereby form solder bumps 22 on the electrode pads 22.

After the flat plate 10 is removed, the solder bumps 22 are coated with rosin flux, and again subjected to the reflow process in a nitrogen atmosphere to modify a bump shape. Thereafter, a rinsing liquid is applied thereto to rinse the residual flux. According to this method, solder bumps having a height of 90 μm are obtained with the result of deviation (standard deviation) of 2.3 μm and without any defective solder bumps. Also it is confirmed by an X-ray transmission camera that there are no voids in the solder bumps.

EXAMPLE 4

Formation of Solder Bumps on BGA Package

The package (first member 18) similar to that in Example 1 is used. The flat plate 10 is formed from a stainless steel sheet having a size of 50×50×0.45 mm, and through holes 12 having the diameter of 0.8 mm are formed in the flat plate 10 at positions corresponding to the positions of the electrode pads by drilling. Thereafter, the surface of the flat plate 10 is plated with chromium. The solder paste 14 comprises a commercially available Sn—Pb type solder paste (RX 363-99 MGO, marketed from Nihon Handa K.K.) and is applied to the flat plate 10 by squeezing. The assembly is treated in a hot air reflow furnace and heated to 230° C. at a rate of 70° C./min, whereby the solder powders are melted to form solder bumps 22 on the electrode pads 20.

After removing the flat plate 10, the residual flux was rinsed by a rinsing liquid (Perclean A011, provided by Nittoh Kagaku K.K.). According to this method, solder bumps having a height of 560 μm are obtained with the result of deviation (standard deviation) of 10 μm and without any defective solder bumps.

As described in detail, according to the present invention, it is possible to form solder bumps having identical sizes and uniform structures which do not contain foreign matter and/or voids in the interior thereof.

Figure 5:
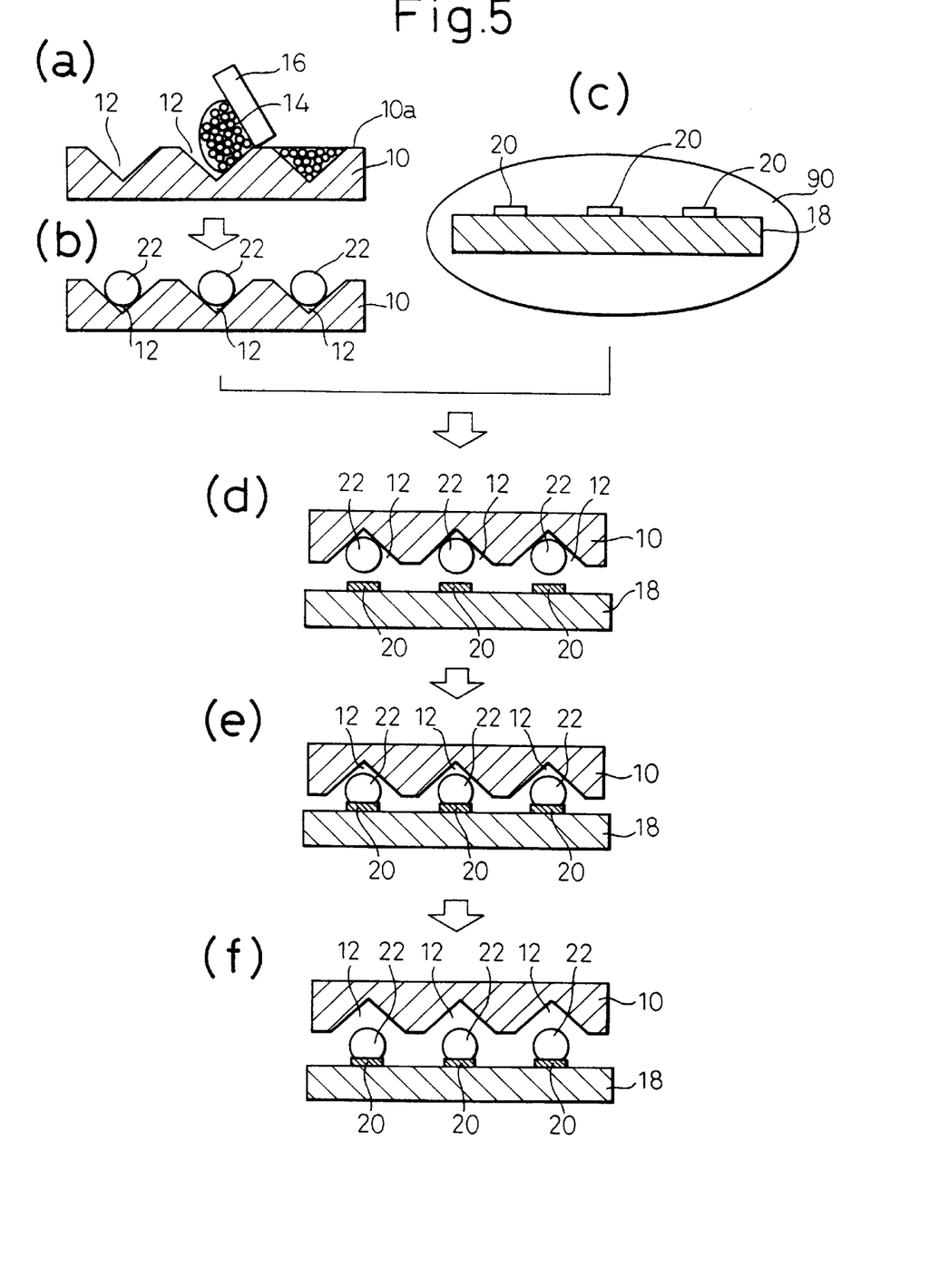
FIGS. 5 is a view illustrating the manufacturing steps of the fourth embodiment of the present invention.

FIG. 5 illustrates a method for forming solder bumps according to the fourth embodiment of the present invention. In this embodiment, by way of an example, solder bumps are formed on electrode pads of a semiconductor chip in order to mount the semiconductor chip to a printed wiring board with the use of solder bumps. In the following description, the semiconductor chip is called an electric component. However, the electric component can be any one such as a semiconductor package or a printed wiring board to which it is desired to form solder bumps.

As shown in (a) of FIG. 5, a flat plate 10 is prepared, which has a plurality of holes (cavities) 12 of the identical shapes on the flat surface 10a thereof. The holes 12 provided in a matrix pattern at the pitch of 200 μm, for example. The flat plate 10 can be preferably made from a material which is hardly wettable by the solder, such as silicon, stainless steel, chromium, glass, ceramic, or titanium, or the surface of the flat plate is preferably coated with a material such as chromium, titanium, or $SiO_2$, which is hardly wettable by the solder.

In a preferable example, the flat plate 10 is made from a silicon wafer arranged so that the flat surface 10a is a <100> crystalline surface, and the holes 12 are formed by carrying out anisotropic etching to the flat surface 10a. In the etching, a resist having square openings is used and the holes 12 are formed in a square frustro-pyramidal shape having a side of 200 μm. In another example, the flat plate 10 is made from a heat-resistant stainless steel sheet (SUS 304) with the holes 12 formed by electric discharge, and the surface thereof is treated to provide an oxidation layer. The holes 12 are circular holes having a diameter of 200 μm and a depth of 50 μm. The shape of the holes 12 are such that the diameter becomes smaller as the depth increases. It is possible to use other techniques such as etching, instead of electric discharge.

The holes 12 of the flat plate 10 are then filled with a solder paste 14, using a squeegee 16, as shown in (a) of FIG. 5. The solder paste 14 comprises a fine solder powder and a flux, the flux including resin, active agent and a solvent. The solder powder is densely and uniformly distributed in the solder paste 14. The solder can be prepared from a known metal such as Ob, Sn, In, or Bi, or an alloy thereof.

The filling of the solder pate 14 in the holes 12 is carried out by sliding the squeegee 16 on the surface 10a of the flat plate 10. Since the volumes of the holes 12 of the flat plate 10 are identical to each other, the amounts of the solder paste 14 filled in the holes 12 are uniform. Since the solder powder is uniformly distributed in the solder paste 14, the volume of the solder powder in each of the holes 12 is substantially the same.

The flat plate 10 is then heated to a temperature higher than the melting point of the solder in the solder paste 14, so that the solder powder is melted and gathers into a rounded form as a solder ball 22 in each hole 12, as shown in (b) of FIG. 5. The flux is separated from the solder balls 22 and the solder balls 22 are kept and the flat plate 10 is cooled.

After the step of (b) of FIG. 5, or before the steps of (a) and (b) of FIG. 5, the step of (c) of FIG. 5 is carried out. In (c) of FIG. 5, an electric component (semiconductor chip) 18 having electrode pads 20 arranged at positions corresponding to the positions of the holes 12 of the flat plate 10 is prepared, and an oxidation layer on the electrode pads 20 of the electric component 18 is removed.

Figure 7:
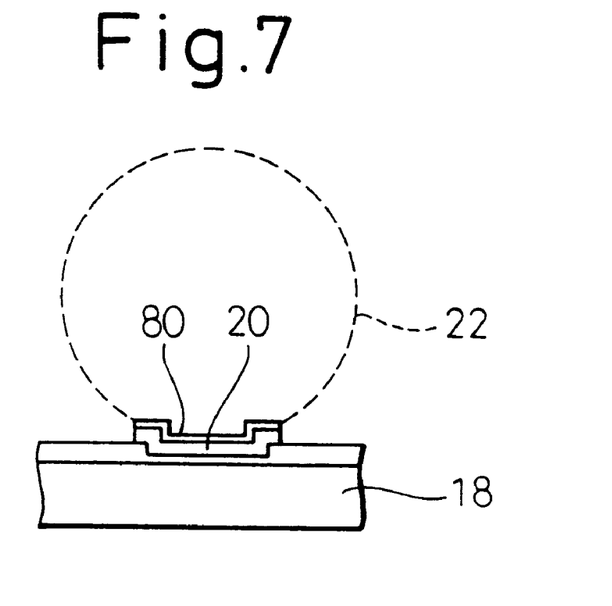
FIG. 7 is a view of the electrode pad with the solder ball formed thereon.

FIG. 7 shows an example of the electric component 18 having the electrode pads 20. These electrode pads 20 preferably comprise a layer of copper or nickel having a thickness greater than 1 μm. Copper or nickel is a material which hardly dissolves in the solder and is suitable for making the electrode pads 20. However, the layer of copper or nickel is liable to have an oxidation layer 80 formed thereon, and the electrode pads 20 become hardly wettable in the solder if the oxidation layer 80 is formed on the electrode pads 20. The solder bumps formed on the electrode pads 20 may fall off the electrode pads 20.

Figure 8:
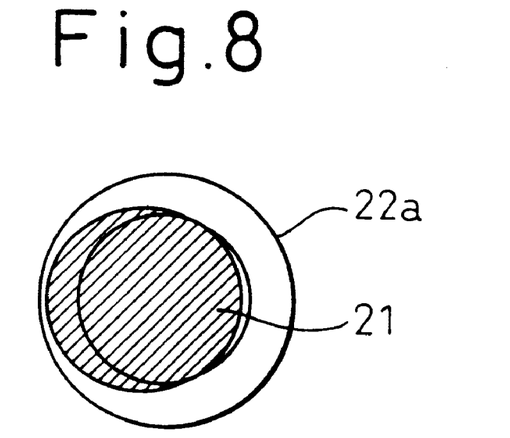
FIG. 8 is a view illustrating an example of the solder ball not uniformly adhered to the electrode pad when an oxidation layer exists on the electrode pad.

FIG. 8 shows an example of a bottom portion 22a of the solder bump 22 soldered to the electrode pad 20, assuming that the oxidation layer 80 is formed on the electrode pads 20 and the solder ball (solder bump) 22 is adhered to the electrode pad 20, as shown in FIG. 7. If the oxidation layer 80 is formed on the electrode pads 20, the solder bump 22 is not necessarily soldered at its entire bottom portion 22a to the electrode pad 20, and the solder bump 22 is weakly soldered at bottom portion, for example, the portion hatched in FIG. 8, to the electrode pad 20. Therefore, if a force is applied to the solder ball (solder bump) 22 by a pin after the solder balls 22 are transferred from the flat plate 10 to the electric component 18, the solder balls 22 may easily be removed from the electrode pads 20. Therefore, it is preferable that any oxidation layer 80 does not exist on the electrode pads 20.

An oxidation preventing layer such as a layer of gold is conventionally provided on the electrode pads 20, so that the solder balls 22 are reliably soldered to the electrode pads 20. However, the layer of gold is liable to easily dissolve in the solder, so that the shape or structure of the electrode pads 20 may possibly and undesirably change. Therefore, it may be sometimes preferable that an oxidation preventing layer such as a layer of gold is not provided on the electrode pads 20 when the solder metal in the solder paste 14 having a higher melting point is used.

In the present invention, the method includes the step of removing an oxidation layer 80 on the electrode pads 20 of the electric component 18 before the solder bumps are formed on the electrode pads 20 of the electric component 18, in order to improve the solderbility of the solder to the copper or nickel electric component 18. In (c) of FIG. 5, the step of removing the oxidation layer 80 on the electrode pads 20 of the electric component 18 comprises deoxidizing the oxidation layer 80 by heating the electric component 18 to a temperature higher than 300° C. in a hydrogen environment. A hydrogen furnace 90 is used for this purpose.

The flat plate 10 and the electric component 18 are then overlapped one above another while the solder balls 22 are positioned relative to the electrode pads 20, as shown in (d) of FIG. 5.

The flat plate 10 and the electric component 18 are then heated in a nitrogen furnace to a temperature higher than the melting point of the solder in the solder past 14 to transfer the solder balls 22 from the flat plate 10 to the electric component 18, as shown in (e) of FIG. 5. Since the flat plate 10 is made from or coated with a material which is hardly wettable in the solder, the solder balls 22 are easily transferred from the flat plate 10 to the electric component 18. Finally, the flat plate 10 is removed from the electric component 18, with the result that the solder balls 22 are attached to the electric component 18, as shown in (f) of FIG. 5.

Figure 6:
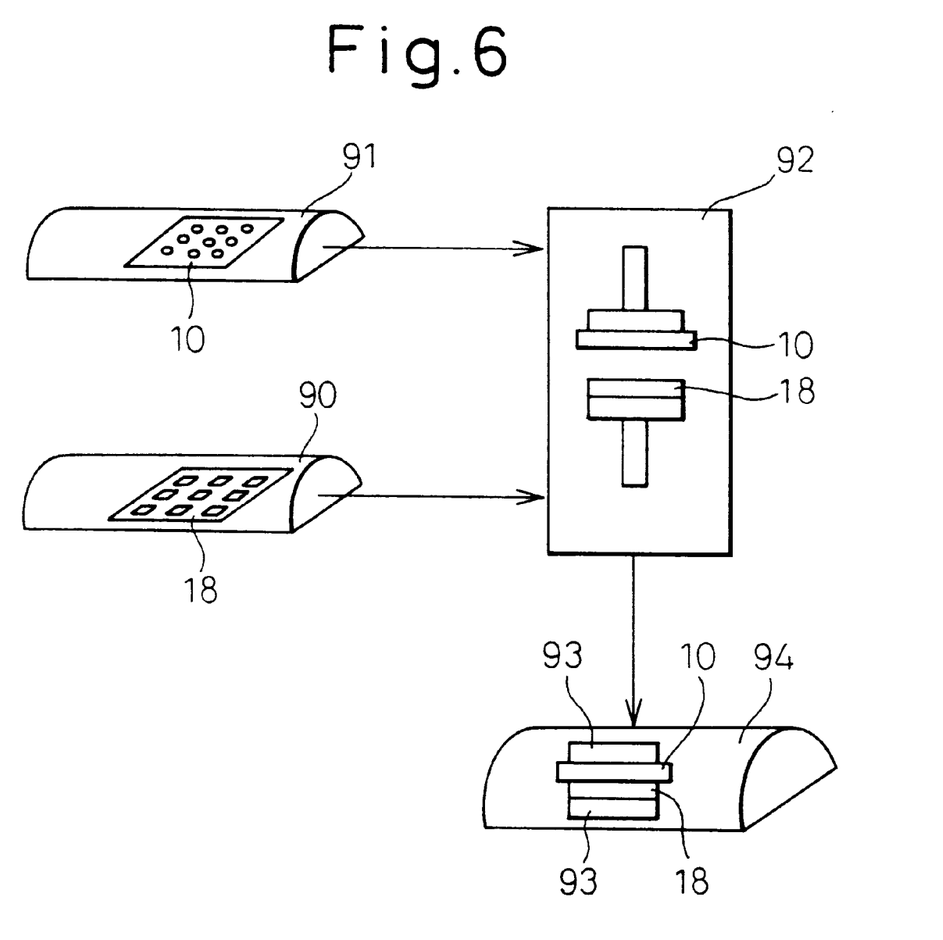
FIG. 6 is a view of the device by which the method for forming solder bumps according to FIGS. 5A to 5E is carried out.

FIG. 6 shows an example of the device by which the method for forming solder bumps according to FIGS. 5A to 5E is carried out. The electric component 18 is heated in a hydrogen furnace 90 to remove the oxidation layer 80 on the electrode pads 20 of the electric component 18. On the other hand, the flat plate 10 is heated in a nitrogen furnace 91 to form the solder balls 22 in the holes 12 of the flat plate 10. The flat plate 10 having the solder balls 22 and the electric component 18 having no oxidation layer 80 are overlapped one above another in a flip-chip bonder 92. It is needless to say that the solder balls 22 and the electrode pads 20 are positioned relative to each other. The overlapping step is carried out at a normal temperature or at a relatively low temperature so that the flat plate 10 and the electric component 18 are not subjected to a high temperature and oxidation does not occur on the surface of the solder balls 22 and the electrode pads 20. The overlapped flat plate 10 and electric component 18 are clamped by an appropriate clamp device 93 and heated in a nitrogen furnace 94 to transfer the solder balls 22 from the flat plate 10 to the electric component 18. Preferably, a time elapsed from the removal of the oxidation layer from the electrode pads 20 of the electric component 18 to the electrode pad 20 to the transfer the solder balls 22 from the flat plate 10 to the electric component 18 is not long. It is advisable to transfer the solder balls 22 from the flat plate 10 to the electric component 18 within four hours from the removal of the oxidation layer from the electrode pads 20 of the electric component 18.

Figure 9:
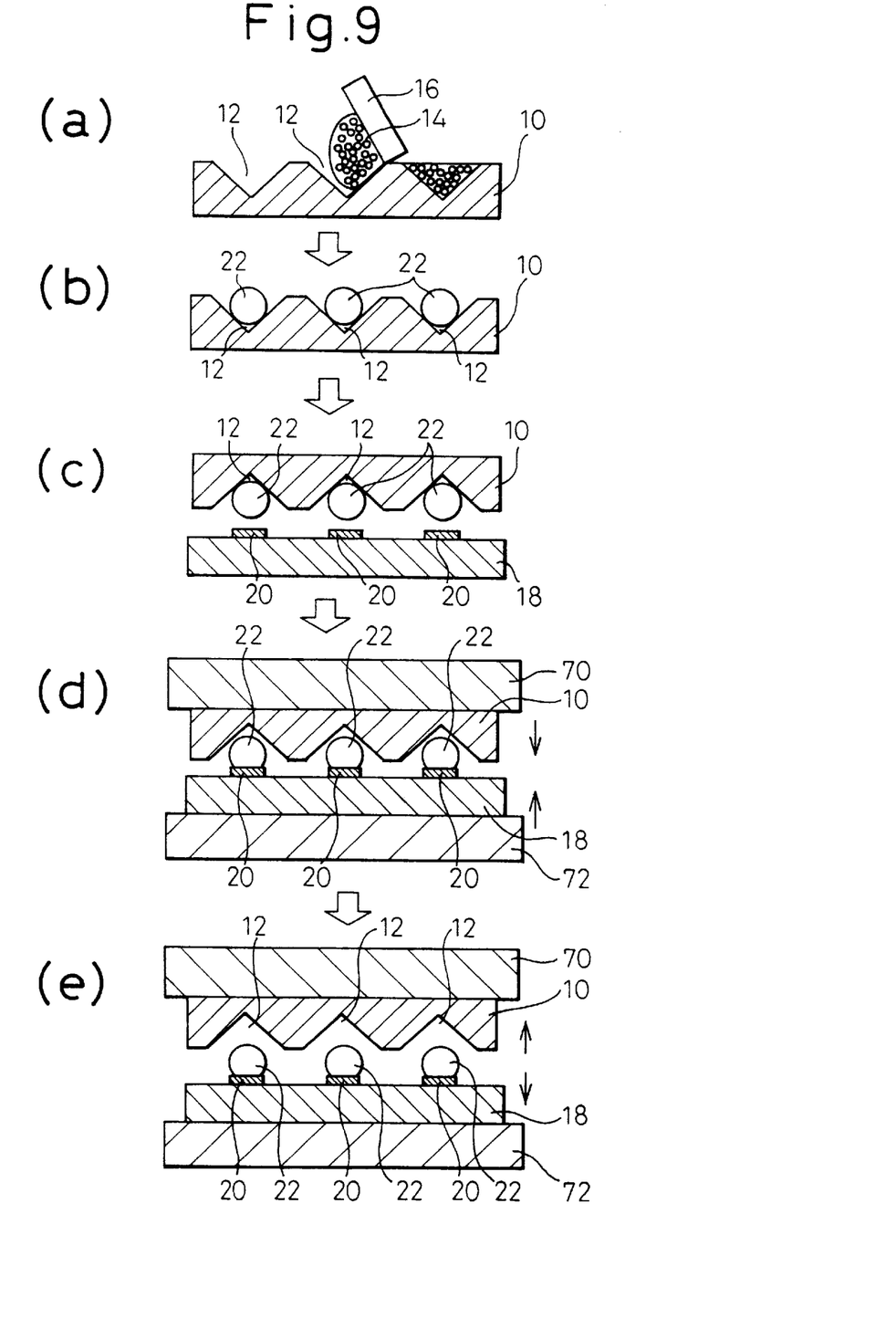
FIG. 9 is a view illustrating the manufacturing steps of a prior art.

FIG. 9 illustrates a method for forming solder bumps according to a prior art (similar to the above described Japanese Unexamined Patent Publication (Kokai) No. 4-263433). The steps of (a), (b), (c), and (e) of FIG. 9 are identical to the steps of (a), (b), (d), and (f) of FIG. 5. The step of (c) of FIG. 5 is not provided in FIG. 9, and the step of (e) of FIG. 5 is different from the step of (d) of FIG. 9. That is, heating and pressing heads 70 and 72 are used in (d) of FIG. 9, to transfer the solder balls 22 to the electrode pads 20. Therefore, a considerable time is necessary to heat the flat plate 10 and the semiconductor chip 18, to allow the solder to flow onto thy entire surface of each of the electrode pads 20, and to cool the flat plate 10 and the semiconductor chip 18, each time after the positioning step of (c). Therefore, a throughput per an apparatus used in this method is low. In the present invention, the nitrogen furnace 90 (see FIG. 6) is used in the step of (e) of FIG. 5. Therefore, many sets of the flat plate 10 and the semiconductor chip 18 with each set positioned in the step of (d) can be simultaneously handled in the nitrogen furnace 90, and a throughput is remarkably increased.

EXAMPLE 5

Formation of Solder Bumps on Silicon Chip

The electric component 18 comprises a silicon chip having 2025 (45×45) nickel electrode pads 20 arranged at a pitch of 210 μm, each electrode pad 20 having a diameter of 80 μm and a thickness of 4 μm.

The flat plate 10 is formed from a silicon <100> wafer of a size of 30×30×0.1 mm (on which a thermal oxidation layer was formed). Resist patterns having a size of 196 μm square are formed on the flat plate 10 and part of the oxidation layer other than that covered with the resist is removed by hydrofluoric acid. Thereafter, the silicon wafer is etched, using an aqueous solution of KOH, whereby the flat plate 10 having the holes 12 in the form of a square frustro-pyamidal shape.

The solder powder in the solder paste 14 is Pb-5Sn (having a particle size in the range between 10 to 32 μm). The solder paste 14 comprises 90 parts by weight of solder powder and 10 parts by weight of rosin-based flux vehicle, these components being mixed and kneaded with each other.

The solder paste 14 is filled in the holes 12 of the flat plate 10 by squeeging and the flat plate 10 is inserted in the nitrogen reflow furnace (oxygen concentration 200 ppm) having a peak temperature of 350° C. to form the solder balls 22. The electric component 18 is treated by plasma ashing and inserted in the hydrogen furnace having the peak temperature of 380° C. to remove the oxidation layer 80 by deoxidation.

The flat plate 10 and the electric component 18 are then overlapped one above another in a flip-chip bonder 92, while the solder balls 22 and the electrode pads 20 are positioned relative to the other. The overlapped flat plate 10 and electric component 18 are then inserted in the nitrogen reflow furnace (oxygen concentration 200 ppm) having the peak temperature of 350° C. to transfer the solder balls 22 from the flat plate 10 to the electric component 18. The flat plate 10 is then removed from the electric component 18, and the solder bumps 22 are coated with rosin flux, and again subjected to a reflow process in the above described reflow condition, and the residual flux was rinsed with a rinsing liquid. As a result, solder bumps of he height of 92 μm are obtained with deviation (standard deviation) of 2.5 μm and without any defective solder bumps. Also, the solder bumps were purposely detached from the electrode pads 20 and it was confirmed that the solder bumps were firmly soldered to the electrode pads 20.

EXAMPLE 6

Formation of Solder Bumps on Aluminum Substrate

The electric component 18 comprises aluminum substrate for mounting a silicon chip. The aluminum substrate has wiring formed by thin-film method and copper electrode pads 20 having a diameter of 80 μm and a thickness of 5 μm.

The flat plate 10 is made from a photosensitive glass plate (PEG 3 provided by HOYA K.K.) having a size of 30×30×3 mm. The holes 12 have square openings with a length of one side of 116 μm and a depth of 50 μm. The holes are formed on the flat plate 10 at positions corresponding to positions of the electrode pads by exposure and etching. The solder paste 14 comprises Pb-63Sn solder 90 parts by weight of powder and 10 parts by weight of rosin-based flux vehicle, these components being mixed and kneaded with each other.

The solder paste 14 is filled in the holes 12 of the flat plate 10 by squeezing and the flat plate 10 is inserted in the nitrogen reflow furnace (oxygen concentration 500 ppm) having the peak temperature of 230° C. to form the solder balls 22. The electric component 18 is immersed in an isopropylalcohol solution including 5% sulfuric acid and rinsed by an isopropylalcohol solution, to dissolve and remove the oxidation layer.

The flat plate 10 and the electric component 18 are then overlapped one above another in a flip-chip bonder 92, while the solder balls 22 and the electrode pads 20 are positioned relative to the other. The overlapped flat plate 10 and electric component 18 are then inserted in the nitrogen reflow furnace (oxygen concentration 500 ppm) having the peak temperature of 230° C. to transfer the solder balls 22 from the flat plate 10 to the electric component 18. The flat plate 10 is then departed from the electric component 18, and the solder bumps 22 are coated with rosin flux, and again subjected to a reflow process in the above described reflow condition, and the residual flux was rinsed with a rinsing liquid. As a result, solder bumps of the height of 92 $\mu$m are obtained with deviation (standard deviation) of 2.5 $\mu$m and without any defective solder bumps. Also, the solder bumps were purposely detached from the electrode pads 20 and it was confirmed that the solder bumps were firmly soldered to the electrode pads 20.

What is claimed is:

1. A method for forming solder bumps, comprising the steps of:

filling holes of a flat plate with a solder paste by squeezing;

heating the flat plate to a temperature higher than the melting point of the solder to form solder balls from the solder paste in the holes of the flat plate;

removing an oxidation layer on electrode pads of an electric component arranged at positions corresponding to those of the holes of the flat plate;

after said removing step, overlapping the flat plate with the electric component one above another while the solder balls are positioned relative to the electrode pads; and after said overlapping step, heating the flat plate and the electric component overlapped with each other to a temperature higher than the melting point of the solder to transfer the solder balls from the flat plate to the electric component.

2. A method for forming solder bumps according to claim 1, wherein the step of removing the oxidation layer on the electrode pads of the electric component comprises deoxidizing the oxidation layer by heating the electric component to a temperature higher than 300° C. in a hydrogen environment.

3. A method for forming solder bumps according to claim 1, wherein the step of removing the oxidation layer on the electrode pads of the electric component comprises immersing the electric component in a solution dissolving the oxidation layer.

4. A method for forming solder bumps according to claim 1, wherein the step of transferring the solder balls from the flat plate to the electric component comprises heating the flat plate and the electric component overlapped with each other to a temperature higher than the melting point of the solder in an environment having an oxygen concentration lower than 1000 ppm.

5. A method for forming solder bumps according to claim 1, wherein the electrode pads comprises a layer of copper or nickel having a thickness greater than 1 $\mu$m.

6. A method for forming solder bumps according to claim 1, wherein the melting point of the solder metal in the solder paste is higher than 250° C.

* * * * *

UNITED STATES PATENT AND TRADEMARK OFFICE
CERTIFICATE OF CORRECTION

PATENT NO. : 6,319,810 B1
DATED : November 20, 2001
INVENTOR(S) : Ochiai et al.

It is certified that error appears in the above-identified patent and that said Letters Patent is hereby corrected as shown below:

<u>Title page,</u>
Item [63], Related U.S. Application Data, change "Continuation in-part of application No. 08/516,284, filed on Aug. 17, 1995" to be -- Continuation in-part of application No. 08/516,284, filed on Aug. 17, 1995; which is a continuation-in-part of application No. 08/374,429 filed on Jan. 19, 1995, now abandoned. --

Signed and Sealed this

Twenty-sixth Day of November, 2002

*Attest:*

*Attesting Officer*

JAMES E. ROGAN
*Director of the United States Patent and Trademark Office*